United States Patent [19]

Ryczek et al.

[11] Patent Number: 5,734,263
[45] Date of Patent: Mar. 31, 1998

[54] ELECTRO-OPTIC VOLTAGE TRANSDUCER WITH EXTENDED RANGE AND TEMPERATURE COMPENSATION

[75] Inventors: Lawrence J. Ryczek, Waukesha; Michael G. Taranowski, Milwaukee, both of Wis.

[73] Assignee: Eaton Corporaton, Cleveland, Ohio

[21] Appl. No.: 597,316

[22] Filed: Feb. 6, 1996

[51] Int. Cl.⁶ .................................................. G01R 19/00
[52] U.S. Cl. ............................................ 324/96; 359/246
[58] Field of Search .......................... 324/72, 96, 753, 324/105; 359/245, 246, 247, 248; 29/886; 349/76, 18

[56] References Cited

U.S. PATENT DOCUMENTS

| | | | |
|---|---|---|---|
| 3,831,106 | 8/1974 | Ward | 372/12 |
| 4,904,931 | 2/1990 | Miller | 324/96 |
| 5,001,419 | 3/1991 | Miller | 324/83 |
| 5,053,696 | 10/1991 | Williamson et al. | 324/121 R |
| 5,059,894 | 10/1991 | Miller | 324/96 |
| 5,109,189 | 4/1992 | Smith | 324/96 |
| 5,247,244 | 9/1993 | Miller et al. | 324/96 |
| 5,255,428 | 10/1993 | Gottsche et al. | 29/886 |
| 5,384,638 | 1/1995 | Takahashi et al. | 356/351 |
| 5,412,500 | 5/1995 | Fergason | 349/76 |
| 5,414,546 | 5/1995 | Fergason | 349/18 |
| 5,444,365 | 8/1995 | Takahashi et al. | 324/96 |
| 5,446,381 | 8/1995 | Okajima et al. | 324/96 |

*Primary Examiner*—Ernest F. Karlsen
*Assistant Examiner*—Anh Phung
*Attorney, Agent, or Firm*—Larry G. Vande Zande

[57] ABSTRACT

In an electro-optic voltage transducer utilizing a crystal exhibiting birefringence in a fast axis and a slow axis mutually orthogonal to an optic axis in the presence of an electric field produced by the voltage to be measured, the crystal is mounted for angular adjustment relative to the direction of propagation of a light beam passing through the crystal and polarized at an angle to the fast and slow axes to provide adjustment of the effective half-wave voltage of the crystal. Preferably, the crystal is a disk mounted for rotation about an axis perpendicular to the optic axis by temperature sensitive mounts extending perpendicular to radii of the disk in order to provide temperature compensation. Greater angular adjustment, which extends unambiguous voltage measurement above the natural half-wave voltage of the crystal, is provided by securing the temperature responsive mounts to a rotatable support disk. An analyzer measures the relative retardation between the fast and slow components of the polarized light beam emerging from the crystal for generating an output representing the value of the applied voltage.

16 Claims, 2 Drawing Sheets

ELECTRO-OPTIC VOLTAGE TRANSDUCER WITH EXTENDED RANGE AND TEMPERATURE COMPENSATION

BACKGROUND OF THE INVENTION

1. Field of the Invention

The invention is directed to electro-optic apparatus for measuring voltage which uses a crystal exhibiting birefringence in the presence of an electric field produced by the voltage to be measured, and more particularly, to such an apparatus which is temperature compensated and can be calibrated to measure voltages greater than the minimum or specified half-wave voltage of the crystal.

2. Background Information

It is known to use electro-optic devices for measuring electrical voltages. For instance, devices known as "Pockel" cells utilize certain crystals which exhibit birefringence; that is, a difference in the index of refraction along two orthogonal axes, in the presence of an electric field. Some of these crystals, such as, for example, BGO (bismuth germate), and KDP (potassium dihydrogen phosphate), have the property that in the absence of an electric field the index of refraction along a light propagation axis is independent of the plane of polarization of the light. However, if an electric field is applied to the crystal, the index of refraction for light polarized in one direction transverse to the light propagation axis known as the fast axis increases, and that in the orthogonal direction, also transverse to the light propagation axis, and known as the slow axis, decreases, each by an amount which is proportional to the strength of the electric field. In such Pockel cell devices, if light is polarized in a plane which forms an angle to these transverse axes, the component of the polarized light in the direction of the slow axis with the decreased index refraction is retarded with respect to the other component. This retardation is typically measured in wave lengths. The retardation is detected in an analyzer and converted to an electrical signal for producing an output representative of the magnitude of the voltage generating the field.

The electric field may be applied to the crystal either parallel or transverse to the direction of light propagation. Where the field is applied parallel to the axis of light propagation, the total voltage drop along the crystal is integrated so that the analyzer output represents the applied voltage. In the case where the field is applied transversely to the axis of light propagation, the analyzer output represents the voltage at the intersection of the field and the light beam.

The relative retardation along the fast and slow axes is affected by temperature. Therefore, in order to have an accurate measure of voltage, temperature compensation must be provided. In addition, due to the cyclic nature of the retardation along the fast and slow axes, the output of the analyzer is only unambiguous for voltages producing a retardation which is less than the half-wave voltage for the crystal. In BGO and KDP, minimum half-wave voltage is about 14.8 kV and 11.300 kV, respectively. Thus, this type of voltage transducer in its present state is not suitable for use over the full range of medium voltage electric power distribution systems where the voltage ranges from 2.4 kV to 34.8 kV. The potential transformers currently used for measuring voltages in such systems leave room for improvement.

There is a need therefore, for improved apparatus for measuring voltages especially in electric power systems.

In particular, there is a need for improved apparatus utilizing birefringent electro-optic crystals for measuring voltages.

More particularly, there is a need for such apparatus which can measure voltages greater than the half-wave voltage of the crystal, and specifically, which can measure voltages over the entire 2.4 kV to 34.8 kV range used in medium voltage power distribution systems.

There is also a need for such apparatus with improved accuracy, and in particular such apparatus which is compensated for temperature variations.

SUMMARY OF THE INVENTION

These needs and others are satisfied by the invention which is directed to apparatus in which adjusting means are provided to adjust the orientation of the direction of the polarized light beam or the electric field produced by the voltage to be measured relative to the axis of light propagation in the birefringent electro-optic crystals in order to adjust the effective half-wave voltage of the crystal. Small adjustments can be used for temperature compensation while larger changes in orientation adjust the range of voltages that can be measured.

The adjustments in orientation can be effected by adjusting the beam generating means generating the polarized light beam together with the analyzer relative to the light propagating axis of the crystal and the direction of the field. Alternatively, the direction in which the field is applied can be adjusted. In the preferred embodiment of the invention, the crystal is rotated relative to the direction of propagation of the polarized light beam and the direction of the electric field.

In this preferred form of the invention, the crystal is mounted by adjusting means for rotating about a pivot axis generally transverse to the axis of light propagation. For temperature compensation, mounts having a given coefficient of thermal expansion expand and contract with temperature to rotate the crystal about the pivot axis. For adjustment of the range of voltage measured by the apparatus, the mounts are secured to a support disk which is rotated about the pivot axis. Preferably, the crystal is a circular disk with its light propagating axis lying in the plane of the disk together with one of the transverse axes, while the other transverse axis is perpendicular to the plane of the disk.

BRIEF DESCRIPTION OF THE DRAWINGS

A full understanding of the invention can be gained from the following description of the preferred embodiments when read in conjunction with the accompanying drawings.

DESCRIPTION OF THE PREFERRED EMBODIMENTS

Figure 1:
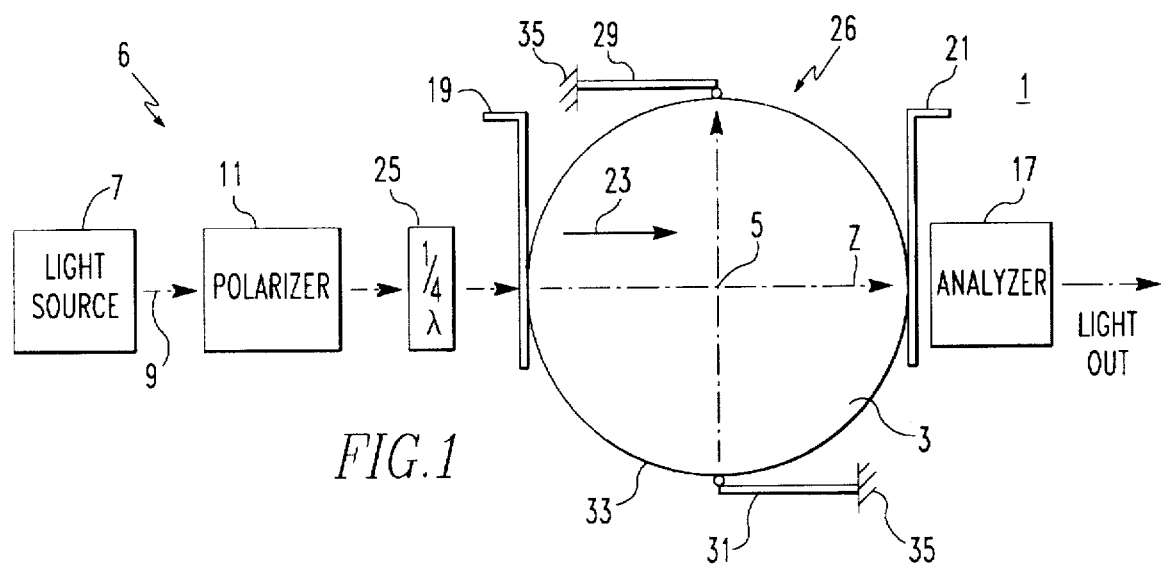
FIG. 1 is a schematic side elevation view of apparatus in accordance with the invention.
Figure 2:
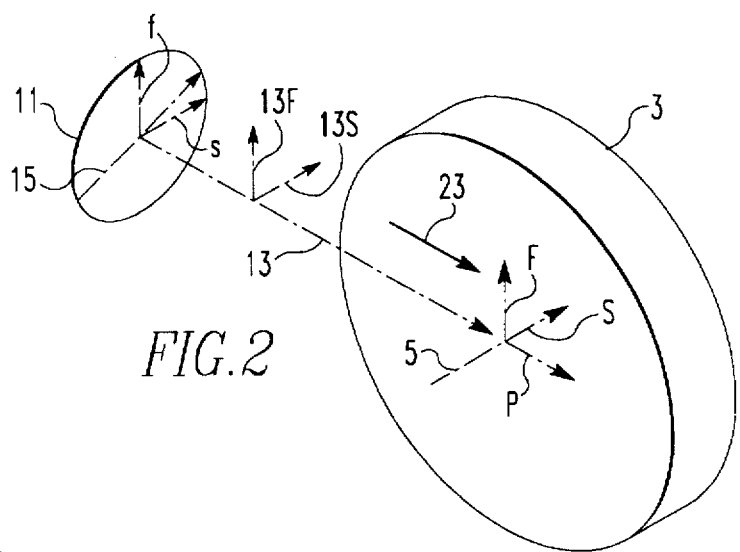
FIG. 2 is a schematic isometric view illustrating the orientation of various axis of the apparatus disclosed in FIG. 1.

Referring to FIG. 1, the apparatus 1 for measuring voltage includes an electro-optic crystal 3 exhibiting birefringence such as a bismuth germate (BGO) crystal or a potassium dihydrogen phosphate (KDP) crystal, with the former being preferred for its stability. As best seen in FIG. 2, the electro-optic crystal 3 has three mutually orthogonal axes: a light propagation axis P, and two transverse axes, including a fast axis F and a slow axis S. With no electric field applied to the crystal 3, the indices of refraction on the transverse axes F and S are the same for light propagating along the axis P. In the presence of an electric field, maximum retardance occurs on the slow, S, axis while minimum or no retardance occurs on the fast, F, axis. The electro-optic crystal 3 is preferably in the form of a disk mounted on an axle 5 forming a pivot axis for rotation of the disk. In the described form of the invention, the light propagation axis P and fast axis F lie in the plane of the disk while the slow axis S is perpendicular to this plane.

Returning to FIG. 1, the voltage transducer includes a beam generator 6 for generating a beam of polarized light. This beam generator 6 includes a light source 7 which generates a collimated beam of light 9 which is passed through a polarizer 11 to produce the beam of polarized light 13. As can be observed from FIG. 2, the polarizer 11 polarizes the collimated beam 9 in a plane 15 which forms a 45° angle with both the fast axis F and the slow axis S of the electro-optic crystal 3. This polarized light beam 13 therefore has a component 13 F parallel to the fast axis F and a slow component 13 S parallel to the slow axis S.

The beam of polarized light 13 is passed through the electro-optic crystal 3 generally along the light propagation axis P. An analyzer 17 detects the fast and slow components 13 F and 13 S of the polarized light beam 13 emerging from the crystal and generates an output signal representative of a voltage applied to the crystal as a function of the difference in phase between the fast and slow components of the polarized beam. The voltage to be measured is to be applied across the electro-optic crystal 3 by conductive wipers 19 and 21. In the embodiment shown in FIG. 1, the applied voltage creates an electric field 23 which is generally parallel to the polarized beam of light 13 and to the light propagation axis P of the crystal. Thus, the wipers 19 and 21 are transparent to the light beam 13. As previously discussed, the electric field produces a difference in the indices of refraction in the fast and slow axes so that the components 13 F and 13 S detected by the analyzer 17 are phase shifted by an amount which is dependant upon the strength of the electric field 23 and therefore the voltage V. A quarter wave plate 25 phase shifts both components of the polarized light beam by 90° so that both positive and negative voltages can be measured.

Figure 3:
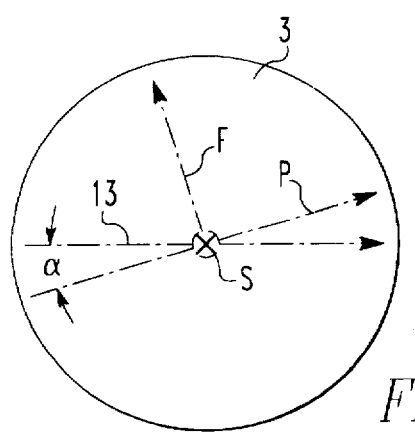
FIG. 3 is a schematic side elevation view illustrating operation of the invention.

The relative retardation produced by the field 23 on the fast and slow components of the polarized light beam 13 is dependant upon temperature. The invention includes adjusting mechanisms 26 which provide adjustments for temperature, as well as, to extend the effective half-wave voltage of the crystal 3. In order to compensate for temperature, the disk shaped electro-optic crystal 3 is mounted for rotation on a shaft 5 which forms a pivot axis. A pair of mounts 29 and 31 are each connected at one end to diametrically opposite points on the periphery 33 of the electro-optic crystal 3. Each of the mounts, 29 and 31, extends tangentially to the periphery 33 and is secured at the opposite end to a fixed support 35. As the mounts 29 and 31 expand and contract with changes in temperature, the electro-optic crystal 3 is rotated about the shaft 5. As can be appreciated from FIG. 3, this rotation of the electro-optic crystal 3 about the shaft 5 produces an angle α between the light propagation axis p of the crystal 3 with the direction of propagation of the polarized beam of light 13. This adjusts the relative magnitude of the fast and slow components 13 F and 13 S of the polarized beam 13 along the fast and slow axes to adjust the total retardation produced by a given strength of the field 23. Thus, the adjustment in the orientation of the orthagonal axes of the electro-optic crystal 3 relative to the beam of polarized light 13 and the field 23 results in adjustment in the effective half-wave voltage of the electro-optic crystal 3. The coefficients of thermal expansion (CTEs) and the length of the mounts 29 and 31 are such that the electro-optic crystal 3 is rotated by an amount which adjusts the effective half-wave voltage of the electro-optic crystal to compensate for temperature.

Figure 4:
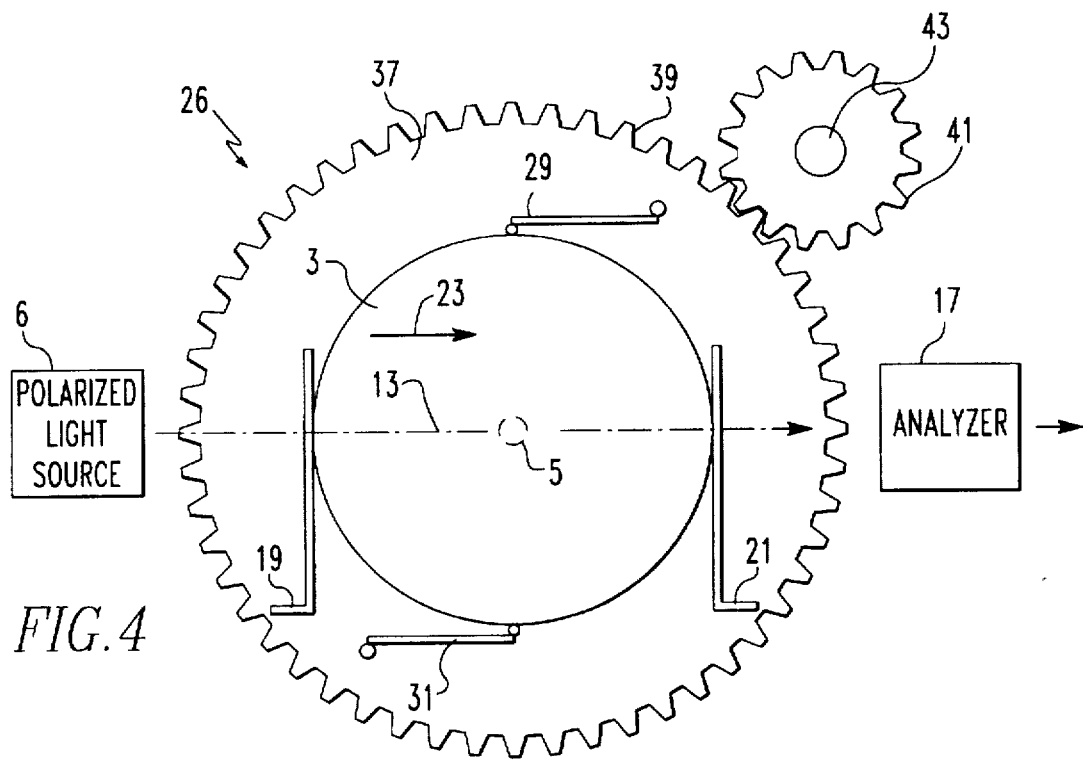
FIG. 4 is a schematic side elevation view of another embodiment of apparatus in accordance with the invention which provides voltage range adjustment in addition to temperature compensation.

Since the medium voltage regime (2.4 kV to 34.8 kV) extends above the half-wave voltage of practical electro-optic crystals having birefringent properties, larger adjustments in the effective half-wave voltage of the electro-optic crystal 3 are needed to provide a transducer which will provide unambiguous voltage readings over the full range of voltages to be measured. This requires larger angles of rotation of the electro-optic crystal 3 relative to the beam of polarized light and is accomplished in the preferred embodiment of the invention by mounting the mounts 29 and 31 on a support disk 37 which also rotates on the shaft 5 as shown in FIG. 4. This support disk 37 has gear teeth 39 at its periphery which are engaged by a calibration gear 41 mounted on a separate shaft 43. Rotation of the calibration gear 41 results in precise adjustment of the rotational position of the larger support disk 37. For measuring voltages below the half-wave voltage of the electro-optic crystal 3, the crystal is positioned so that the light propagation axis P is parallel to the polarized light beams 13 as shown in FIG. 1. For voltages above the natural half-wave frequency of the electro-optic crystal 3, the calibration gear 41 is rotated to increase the angle between the light propagation axis P and the direction of propagation of the beam 13 by an amount which brings the effective half-wave voltage of the electro-optic crystal 3 above the voltage to be measured. With this arrangement, the scaling of the measurement of voltages below the natural half-wave voltage of the crystal is maintained while the upper limit of the unambiguous voltage measurement can be raised to accommodate for voltages of greater magnitudes.

Figure 5:
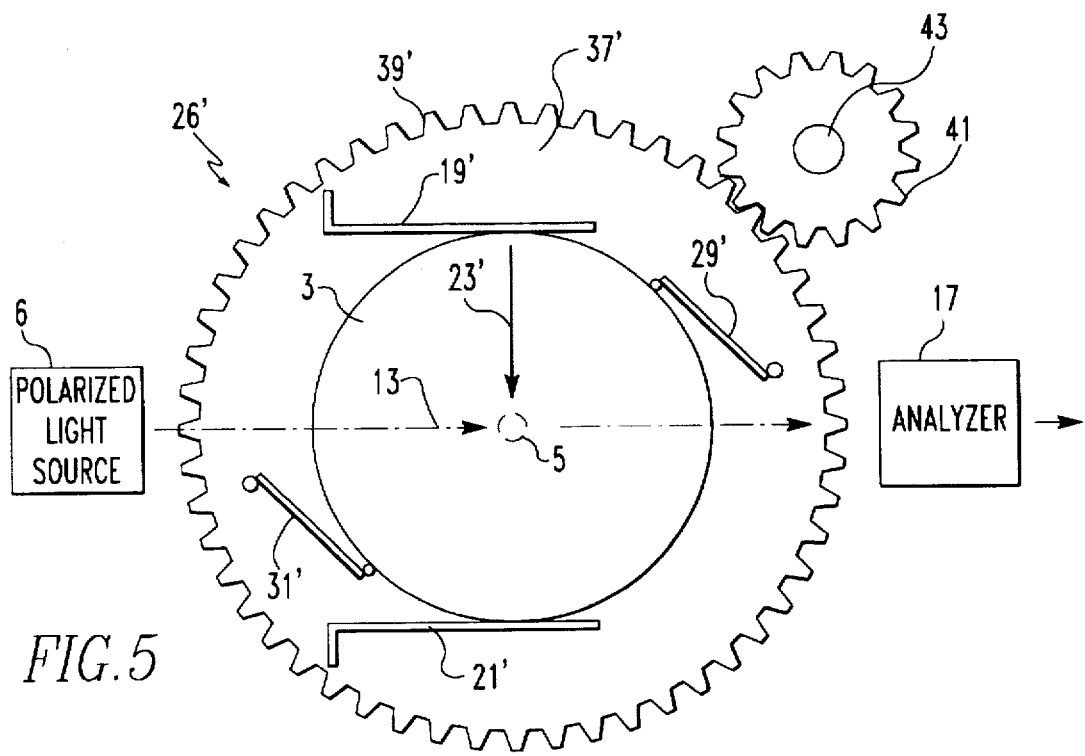
FIG. 5 is a schematic side elevation view of another embodiment of the invention in which the field is generally transverse to the polarized light beam.

Alternatively, as shown in FIG. 5 the wipers 19' and 21' can be positioned to generate the field 23' which is transverse to the direction of propagation of the polarized light beam 13. With this arrangement, the voltage measured is the voltage at the intersection of the field with the polarized light beam. As with the embodiment shown in FIGS. 1–3, the temperature responsive mounts 29' and 31' provide temperature compensation by adjusting the angular relation between the orthogonal axes of the electro-optic crystal 3 and the direction of propagation of the polarized light beam 13. In addition, the support disk 37' can be rotated to make larger adjustments in the effective half-wave voltage of the electro-optic crystal 3 to extend the range of voltage measurement.

While the preferred embodiments of the invention provide for adjustment of the position of the orthogonal axes of the crystal with respect to the direction of propagation of the polarized light beam 13 and the direction of the field 23, alternatively, the direction of the propagation of the polarized light beam or the direction of the electric field can be adjusted to implement temperature compensation and/or range extension.

The invention also provides the capability for calibrating the transducer for use with different voltage systems such as: 2.4 kV, 4.8 kV, 12 kV, etc.

While specific embodiments of the invention have been described in detail, it will be appreciated by those skilled in the art that there are modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalence thereof.

What is claimed is:

1. Apparatus for measuring a voltage, comprising:

a birefringent electro-optic crystal having orthogonal axes, including a light propagation axis, a fast axis, and a slow axis, and having a specified half-wave voltage;

polarized light generating means generating polarized light which is passed through said crystal in a direction producing a fast axis light component and a slow axis light component;

field generating means generating from said voltage an electric field passing through said electro-optic crystal;

analyzer means responsive to said fast axis light component and said slow axis light component emerging from said electro-optic crystal for generating an output representative of said voltage; and adjusting means for adjusting orientation of one of: (a) said electro-optic crystal, (b) said field generating means and (c) said polarized light generating means and analyzer means, relative to the others, to produce an adjustable effective half-wave voltage from said specified half-wave voltage which adjusts said output relative to said voltage.

2. The apparatus of claim 1 wherein said adjusting means comprises means responsive to temperature adjusting said orientation to compensate said half-wave voltage, and therefore said output, relative to said voltage for variations in temperature.

3. The apparatus of claim 2 wherein said voltage exceeds said specified half-wave voltage of said electro-optic crystal and wherein said adjusting means further includes means adjusting said orientation to adjust said effective half-wave voltage to be at least as great as said voltage.

4. The apparatus of claim 2 wherein said adjusting means comprises means adjusting said orientation of said electro-optic crystal relative to said field-generating means and to said polarized light generating means and analyzer means.

5. The apparatus of claim 4 wherein said means adjusting orientation of said electro-optic crystal comprises mounting means mounting said electro-optic crystal for rotation about a pivot axis generally transverse to said light propagation axis and wherein said polarized light generating means directs said polarized light in a plane containing said light propagating axis and at an angle to said light propagation axis adjusted by said adjusting means.

6. The apparatus of claim 5 wherein said mounting means comprises mounts with a known coefficient of thermal expansion mounted to rotate said electro-optic crystal about said pivot axis by an amount which is a function of temperature.

7. The apparatus of claim 6 wherein said voltage is greater than said specified half-wave voltage of said electro-optic crystal, and wherein said adjusting means further includes a mounting support to which said mounts are secured, and means rotating said mounting support about said pivot axis to adjust said effective half-wave voltage.

8. The apparatus of claim 1 wherein said voltage exceeds said specified half-wave voltage and wherein said adjusting means comprises means adjusting said orientation to adjust said effective half-wave voltage to be at least as great as said voltage.

9. The apparatus of claim 8 wherein said adjusting means comprises means adjusting orientation of said electro-optic crystal relative to said field-generating means and to said polarized light generating means and analyzer means.

10. The apparatus of claim 9 wherein said means adjusting orientation of said electro-optic crystal comprises mounting means mounting said crystal for rotation about a pivot axis generally transverse to said light propagating axis, and wherein said polarized light generating means directs said polarized light in a plane containing said light propagating axis and at an angle to said light propagating axis adjusted by said adjusting means.

11. The apparatus of claim 1 wherein said adjusting means comprises means adjusting orientation of said electro-optic crystal relative to said field generating means and to said polarized light generating means and analyzer means.

12. The apparatus of claim 11 wherein said means adjusting orientation of said electro-optic crystal comprises mounting means mounting said electro-optic crystal for rotation about a pivot axis generally transverse to said light propagating axis and wherein said polarized light generating means directs said polarized light in a plane containing said light propagating axis and at an angle to said light propagating axis adjusted by said adjusting means.

13. The apparatus of claim 12 wherein said mounting means includes mounts with a known coefficient of thermal expansion mounted to rotate said electro-optic crystal about said pivot axis by an amount which is a function of temperature.

14. The apparatus of claim 13 wherein said voltage exceeds said specified half-wave voltage of said electro-optic crystal and wherein said adjusting means further includes a mounting support to which said mounts are secured, and means rotating said mounting support about said pivot axis to adjust said effective half-wave voltage.

15. The apparatus of claim 11 wherein said field generating means generates an electric field at an angle to said beam of polarized light which is nominally 0°, and where said adjustment means adjusts said angle from said 0°.

16. The apparatus of claim 11 wherein said field generating means generates said field at an angle which has a nominal value of about 90° to the polarized light and wherein said adjusting means adjusts said angle from said nominal value of about 90°.

* * * * *